United States Patent
Arami et al.

[11] Patent Number: 6,014,943
[45] Date of Patent: Jan. 18, 2000

[54] PLASMA PROCESS DEVICE

[75] Inventors: Junichi Arami, Tokyo; Hiroo Ono, Yamanashi-ken; Tomomi Kondo, Kofu; Koji Miyata, Sabae, all of Japan

[73] Assignees: Tokyo Electron Limited; Shin-Etsu Chemical Co., Ltd., both of Tokyo, Japan

[21] Appl. No.: 08/928,026

[22] Filed: Sep. 11, 1997

[30] Foreign Application Priority Data

Sep. 12, 1996 [JP] Japan ................................. 8-263699

[51] Int. Cl.$^7$ ................................................. C23C 16/00
[52] U.S. Cl. ................ 118/723 E; 156/345; 204/298.37
[58] Field of Search ................ 118/723 R, 723 MR, 118/723 MA, 723 E; 156/345; 315/111.41; 204/298.16, 298.17, 298.18, 298.19, 298.2, 298.21, 298.22, 298.23, 298.37

[56] References Cited

U.S. PATENT DOCUMENTS

| | | | |
|---|---|---|---|
| 5,444,207 | 8/1995 | Sekine et al. | 219/121.43 |
| 5,519,373 | 5/1996 | Miyata | 335/306 |
| 5,717,294 | 2/1998 | Sakai et al. | 315/111.41 |

FOREIGN PATENT DOCUMENTS

| | | |
|---|---|---|
| 4-218913 | 8/1992 | Japan . |
| 6-53177 | 2/1994 | Japan . |
| 7-169591 | 7/1995 | Japan . |
| 7-197252 | 8/1995 | Japan . |
| 7-197255 | 8/1995 | Japan . |
| 7-201493 | 8/1995 | Japan . |

*Primary Examiner*—Bruce F. Bell
*Assistant Examiner*—Thomas H. Parsons
*Attorney, Agent, or Firm*—Oblon, Spivak, McClelland, Maier & Neustadt, P.C.

[57] ABSTRACT

A plasma process device includes a process vessel having a plasma generating area therein, a susceptor provided in the process vessel for supporting a substrate having a process surface, and a gas inlet means for introducing a process gas into the plasma generating area. A dipole ring magnet is arranged around the outer periphery of the process vessel, for generating a magnetic field having a magnetic line of force in the plasma generating area, so that a plasma of the process gas is generated in the plasma generating area. The dipole ring magnet has a plurality of anisotropic segment magnets arranged on an oval track, which are cylindrical permanent magnets having the same shape and size and magnetized in the diameter direction.

12 Claims, 9 Drawing Sheets

PLASMA PROCESS DEVICE

BACKGROUND OF THE INVENTION

The present invention relates to a plasma process device for applying various plasma processes, such as an etching process, to a substrate.

Up until now, when a substrate is processed by etching, sputtering, or CVD in semiconductor manufacturing processes, a plasma process device has been used. In the plasma process device, a predetermined process is applied to a substrate such as a semiconductor wafer (hereinafter, referred to as "wafer") in a plasma atmosphere which is generated by introducing a process gas into a process vessel and converting the process gas into a plasma-state gas. In recent years, the degree of integration of semiconductor devices has been increased and wafers have become larger. Under these circumstances, it is considered particularly important that a micro process is performed uniformly at a high rate in the plasma process device.

Taking an etching device for example, it is desirable to attain the micro-processing by generating a high density plasma in a process chamber. Simultaneously it is also desirable that etching be performed uniformly over the entire wafer at a higher rate.

To attain these, a plasma generation device having a dipole ring magnet is proposed by Jpn. Pat. Appln. KOKAI Publication No.6-53177. The dipole ring magnet is formed of a plurality of anisotropic segment magnets arranged along the outer periphery of a process vessel. This plasma generation device is developed to attain more uniform plasma density than in a conventional device using a magnetron plasma, by improving the uniformity of a magnetic field, particularly the uniformity of the magnetic field along the surface of a substrate.

In the conventional dipole ring magnet formed of the anisotropic segment magnets, the intensity distribution of the resultant magnetic field on or above the substrate, formed by the dipole ring magnet exhibits virtually an oval shape, as shown in FIGS. 11A and 11B. The N-S pole direction corresponds to the short axis of the oval. The perpendicular direction (E-W pole direction) to the N-S pole direction corresponds to the long axis of the oval. Because of the oval shape, the intensity of the magnetic field of the N-S pole direction differs from that of the perpendicular direction. As a result, the magnetic field cannot be formed uniformly over the entire surface of the substrate with a high accuracy. In FIG. 11A, the abscissa indicates a horizontal distance from a center of a substrate. The ordinate indicates an intensity of the magnetic field. Curve a represents an intensity distribution of the magnetic field in the N-S pole direction. Curve b represents an intensity distribution of the magnetic field in the E-W pole direction. FIG. 11B shows a magnetic-field distribution parallel to the upper surface of a substrate. The abscissa indicates the N-S direction. The ordinate indicates the E-W pole direction. The intersection between the ordinate and the abscissa coincides with the center of the substrate surface. Considering an influence of an E×B drift movement of the electrons in a plasma, the electrons tend to move to the side of the W-pole from the side of the E-pole side, so that the electrons are collected on the W-pole side. To prevent this influence, it is necessary to form a so-called inclined magnetic field in which the intensity of the magnetic field decreases toward the W-pole side from the E-pole side to change the drift movement direction of the electrons so that the electrons are not collected on one pole side. It is preferable to perform a uniform plasma process such that the anisotropic segment magnets constituting the dipole ring form a magnetic field parallel to the processing surface of the wafer over the wafer in the plasma area. However, in practice, the generated magnetic field have upwardly and downwardly projected curve components on the upper and down sides. Therefore, it is difficult to further improve the uniformity of the plasma density. This is a reason why the plasma process is not performed uniformly.

BRIEF SUMMARY OF THE INVENTION

The present invention relates to a plasma process device comprising a dipole ring magnet which includes a plurality of anisotropic segment magnets arranged around the outer periphery of a process vessel. The plasma process device is capable of performing a desired uniform plasma process to the substrate by correcting the magnetic field generated by each of anisotropic segment magnets, and thereby, improving the uniformity of the plasma in the process vessel.

A plasma process device according to one aspect of the present invention comprises:

a process vessel, having a plasma generating area therein;

support means provided in the process vessel for supporting a substrate having a process surface which faces the plasma generating area;

gas introducing means for introducing a process gas into the plasma generating area; and plasma generation means including a dipole ring magnet arranged around the outer periphery of the process vessel, for generating a magnetic field having a magnetic line of force in the plasma generating area, the plasma generation means generating a plasma of the process gas in the plasma generating area, the dipole ring magnet having a plurality of anisotropic segment magnets arranged on an oval track.

As descried, the anisotropic segment magnets are arranged ovally in the plasma process device. By this arrangement, the oval-shape magnetic field (viewing from above) formed by conventional dipole ring magnet of the plasma process device, can be corrected. As a result, a uniform magnetic field can be obtained in the space from the substrate surface to the outer peripheral portion of the substrate and in the upper plasma generation space above the substrate. Hence, a desired uniform plasma process can be applied to the substrate.

In the meantime, it has been proposed in the art that the magnetic moment is controlled by changing the magnetic forces of individual segment magnets appropriately. According to the present invention, the similar magnetic moment control can be made if the distances between respective segment magnets and the substrate are different due to the oval arrangement of the segment magnets. Consequently, the magnetic field can be easily controlled. The dipole ring magnet can be formed of the same shape and size of anisotropic segment magnets made of the identical material, as described above. Therefore, even if the size of the plasma process device is increased with an increase in the substrate size, the manufacturing cost of the anisotropic segment magnets can be reduced.

A plasma process device according to another aspect of the present invention comprises:

a process vessel having a plasma generating area therein;

support means provided in the process vessel, for supporting a substrate having a process surface which faces the plasma generating area;

gas introducing means for introducing a process gas into the plasma generating area; and plasma generation means including a dipole ring magnet arranged around the outer periphery of the process vessel for generating a magnetic field having a magnetic line of force in the proximity of the process surface, the plasma generation means generating a plasma of the process gas in the plasma generating area;

the dipole ring magnet arranged along the outer periphery of the process vessel, and having a plurality of anisotropic segment magnets extending perpendicularly to the process surface and an auxiliary magnet provided at least one end of each of the extending plural anisotropic segment magnets, for correcting a perpendicular component of a magnetic field of the process vessel.

To explain more specifically, the anisotropic segment magnets having an auxiliary magnet of the present invention are used in place of a plurality of anisotropic segment magnets (arranged along the outer periphery of the process vessel constituting a dipole ring magnet in the plasma process device). As a result, the perpendicular component of the magnetic field formed in the process vessel can be corrected. In other words, the auxiliary magnets appropriately correct the convex-form (perpendicularly extended) magnetic field formed by the anisotropic segment magnet. As a result, a magnetic field parallel to the process surface can be generated in the space from the substrate surface to the outer peripheral margin and in the plasma generation space. Accordingly, the plasma process of the substrate is performed more uniformly than in the conventional process. The auxiliary magnet used herein must have a perpendicular component of the magnetic field vector. The auxiliary magnet is preferably magnetized in the perpendicular direction in order to effectively correct the magnetic field.

The plasma process device according to a further aspect of the present invention:

a process vessel having a plasma generating area therein, support means provided in the process vessel, for supporting a substrate having a process surface which faces the plasma generating area;

gas introducing means for introducing a process gas into the plasma generating area; and plasma generating means including a dipole ring magnet arranged around the outer periphery of the process vessel, for generating a magnetic field having a magnetic line of force in the plasma generating area, the plasma generation means generating a plasma of the process gas in the plasma generating area, proximity of the process surface, the dipole ring magnet arranged around the outer periphery of the process vessel and having a plurality of cylindrical anisotropic segment magnets having the same magnetic force and the anisotropic segment magnets arranged in such a way that a first distance between adjacent anisotropic segment magnets positioned at a north pole and at a south pole of the resultant vector of the magnetic field formed by the anisotropic segment magnets, is different from a second distance between adjacent anisotropic segment magnets positioned at an upper end and at a lower end of the line crossed perpendicularly to the N-S pole line.

When a plurality of anisotropic segment magnets are arranged ovally, the longer the long axis, the larger the resulting dipole ring magnet. In this case, if the distance between the adjacent segment magnets is changed by appropriately thinning out the segment magnets, that is, by reducing the number of the anisotropic segment magnets, the long axis of the oval dipole ring magnet can be shortened while a desired magnetic-field generation is maintained. As a result, the size of the plasma process device can be reduced.

When a plurality of the anisotropic segment magnets are arranged circularly, minor control of the magnetic field can be made by changing the distance between adjacent anisotropic segment magnets appropriately. If the number of the segment magnets is decreased, the manufacturing cost can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

Prior Art

DETAILED DESCRIPTION OF THE INVENTION

Hereinbelow, Embodiments will be explained in which the present invention is applied to etching devices.

Figure 1:
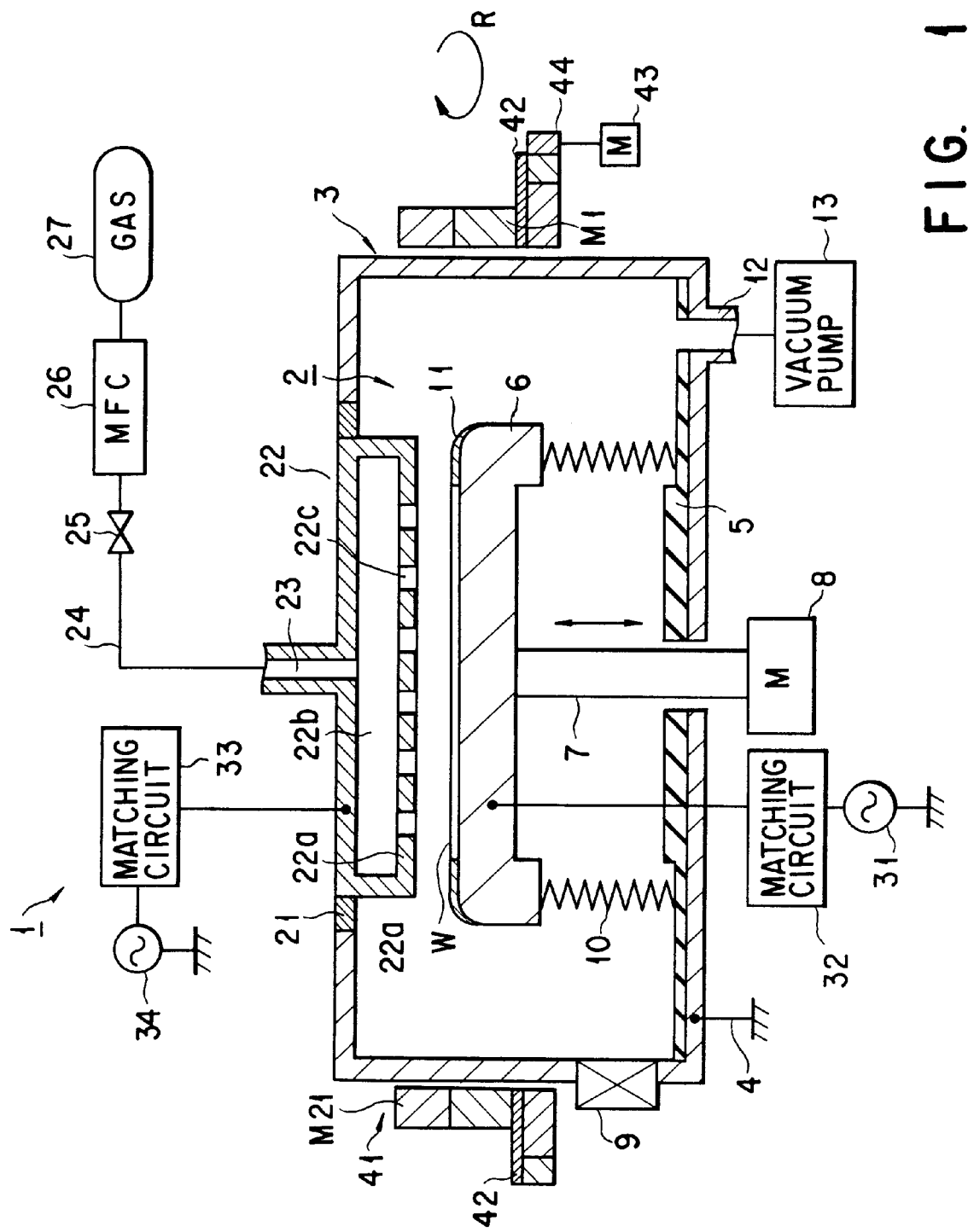
FIG. 1 is a schematically cross-sectional view of an etching device according to a first embodiment of the present invention.

FIG. 1 is a schematic cross-sectional view of an etching device 1 according to a first embodiment. The etching device 1 has a process chamber 2 which is defined within a cylindrical process vessel 3 made of a metal e.g., an anodized aluminum. The process chamber 2 can be opened or closed airtight. The process vessel 3 itself is grounded, for example, by connecting to a ground line 4.

Over the entire inner bottom wall of the process chamber 2, a non-conductive supporting board 5 is provided. Above the insulation supporting board 5, a virtually cylindrical susceptor 6 for mounting a substrate W (e.g., a 12-inch wafer) thereon, is provided coaxially with the process vessel. The susceptor 6, whose surface is formed of anodized aluminum, serves a lower electrode.

The susceptor 6 is supported by one end of a support pole 7. The other end of the support pole 7 projects outwardly from the bottom wall of the process vessel. The support pole 7 is movably provided in the process vessel. To be more specific, the support pole 7 can move vertically (as indicated by a double-headed arrow in the figure) under the control of a driving source 8 (e.g., a motor) provided outside of the process vessel 3. FIG. 1 shows the position of the susceptor 6 during etching. When the wafer W is loaded/unloaded, the susceptor 6 is descended to the position which is at the same level as that of a gate valve 9 (for use in loading/unloading) provided at the side portion below the process vessel. In the periphery of the support pole 7, bellows 10 are provided for ensuring the airtightness. One end of the bellows is connected to the upper surface of the insulation supporting body 5. The other end is connected to the lower peripheral surface of the susceptor 6.

On the susceptor 6, an electrostatic chuck (not shown) is provided for holding the wafer W by vacuum-adsorption. The wafer W is disposed in a predetermined position on the electrostatic chuck. On the outer peripheral surface of the susceptor 6, a conductive focus ring 11 is provided so as to surround the wafer. The focus ring 11 has a function of improving uniformity of the plasma density in the periphery of the wafer W.

At the bottom wall of the process vessel 3, an exhaust duct 12 is partially provided so as to face the opening of the supporting board 5. The exhaust duct 12 can communicate with vacuum means 13 such as a turbo molecular pump. The pressure in the process vessel 3 can be reduced to, e.g., 10 mTorr by the operation of the vacuum means 13 through the evacuation duct 12. The reduction of the pressure of the process vessel 3 and maintenance of the reduced pressure are automatically controlled on the basis of detection signals transmitted from a pressure sensor (not shown) provided on the process vessel 3.

A circular opening is provided in the center of the upper wall of the process chamber. In the periphery of the circular opening, a non-conductive ring 21 made of alumina or the like is set. To the ring 21, an upper electrode 22 is provided so as to face the susceptor 6 and thus the wafer W mounted thereon with a predetermined distance apart from the wafer W. The entire upper electrode 22 of this preferable embodiment is made of a conductive material such as surface-anodized aluminum. However, the upper electrode 22 is not necessarily entirely made of the conductive material. If at least the lower wall 22a facing the wafer W is made of a conductive material to high frequency, such as single crystal silicon, other portions of the upper electrode 22 may be formed of an insulating material. In this case, since the lower wall 22a acts as an upper electrode, a high frequency current source described later must be electrically connected to the lower wall 22a.

The upper electrode 22 has a cylindrical hollow portion 22b, the lower end of which is closed by a lower wall 22a and the upper end of which is blocked with an upper wall placed at the same level of the upper wall of the vessel 3. At the center of the upper wall of the upper electrode 22, a gas inlet 23 communicable with the hollow portion 22b, is provided. In the lower wall 22a facing the wafer W, a number of gas-emitting holes 22c are formed with a predetermined distribution, for supplying a process gas above the entire wafer surface W uniformly.

To the gas inlet 23, a gas supply pipe 24 is connected. To the gas supply pipe 24, a process gas supply source 27 is connected via a valve 25 and a mass-flow controller 26 for controlling a flow rate. In this embodiment, a predetermined process gas, for example, a CF series etching gas such as a $CF_4$ gas or a $C_4F_8$ gas is supplied from the process gas supply source 27. The etching gas is emitted from the gas-emitting holes 22c of the upper electrode 22, at a flow rate controlled by the mass-flow controller 26, and supplied uniformly to the wafer W, in other words, into the plasma generation space between the susceptor 6 and the upper electrode 22.

Now, the frequency power supply system of the etching device 1 will be explained. A first high frequency power source 31 is used for generating a high frequency power having a frequency of several hundreds kHz, e.g., 800 kHz. The first high frequency power source 31 is connected to the susceptor 6 (the lower electrode) by way of a matching device 32 having a blocking condenser. On the other hand, a second high frequency power source 34 is connected to the upper electrode 22 by way of a matching device 33. The second high frequency power source 34 is used for generating a high frequency power having a frequency of e.g., 27.12 MHz which is higher than that of the first high frequency power source 31.

Figure 2:
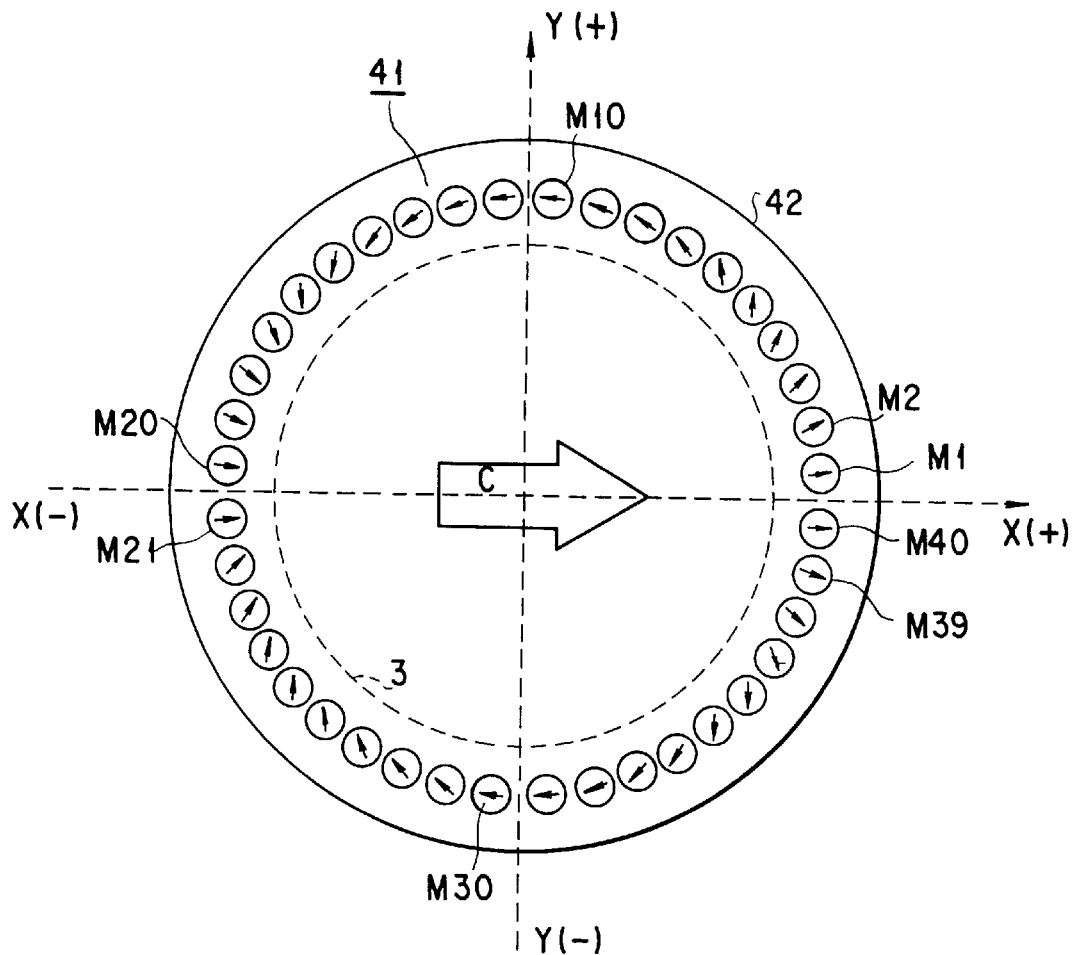
FIG. 2 is a plan view of a dipole ring magnet used in the etching device of FIG. 1, showing the magnetizing directions of individual segment magnets of the dipole ring magnet.

Along the periphery of the process vessel 3, the dipole ring magnet 41 according to this embodiment is provided as a magnetic-field generation means. The dipole ring magnet 41 comprises 40 cylindrical magnets designated segment magnets M1 to M40, which are ovally arranged at small intervals on a ring-form rotation stage 42 as shown in FIG. 2. Each of these segment magnets M1 to M40 is an anisotropic segment magnet. The segment magnets are formed in the same shape and size and magnetized in the diameter direction. The segment magnets are arranged on the rotation stage 42 in such a way that the individual magnetizing directions are set as indicated by arrows shown in FIG. 2. The rotation stage 42 itself is rotatably supported by a supporting body (not shown) and rotated by driving means 43 such as a motor and transmission means 44, as shown in FIG. 1. The rotation stage 42 is rotated around the outer periphery of the process vessel 3 concentrically with the process vessel. An example of usable transmitting means may be a gear train constructed by a ring-form gear and a pinion. The ring-form gear is coaxially fixed to the outer periphery of the stage 42 and has teeth along the outer periphery thereof. The pinion is coaxially fixed to the rotation shaft of the motor 43, and engaged with the teeth of the ring-form gear. The rotation stage 42 is rotated in the direction as indicated by an circular arrow R shown in FIG. 1.

Figure 3:
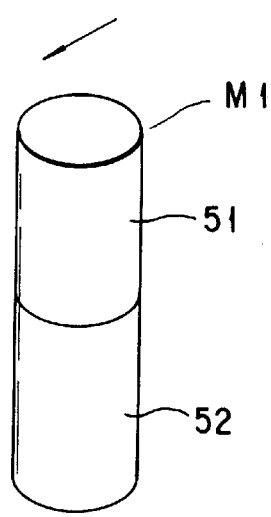
FIG. 3 is a perspective view of a segment magnet employed in the dipole ring magnet of FIG. 2.

Since the segment magnets M1 to M40 are formed in the same shape and size, as previously described, we will take segment magnet M1 as a representative example for the following explanation. Segment magnet M1 has a circular column form having two cylindrical magnet members 51 and 52 superposed one upon the other and tightly connected, as shown in FIG. 3. The magnet members 51 and 52 may be formed by connecting two pieces and then magnetizing the pieces. Alternately the magnet members 51 and 52 may be initially formed in one body. It is preferred that a magnetic field component to be formed in the middle of the vertical direction be controlled by providing a slit or a space between magnet members 51 and 52 or interposing a non-magnetic material between them. The segment magnet M1 thus constructed is magnetized, so that magnet members 51 and 52 are magnetized in the direction, for example, indicated by an arrow in FIG. 3 (the arrow points to the north pole). Note that the magnetizing direction of the magnet members 51 and 52 is exactly identical.

The segment magnets M1 to M40 having the same size and shape and magnetized in the diameter direction are arranged in a circuit on the rotation stage 42 as shown in FIG. 2. On the stage 42, each segment magnet has its magnetization axis slightly inclined, by an equal angle, to that of the immediate segment magnet such that the magnetization axes of any two diametrically opposite magnets extend in the same direction. Hence, the magnetization axes of the magnets M1 to M20 coincide with those of the magnets M21 to M40, respectively. More precisely, the magnetization axes of the magnets M1 and M21 extend in the same direction, and so are the magnetization axes of the magnets M20 and 40.

By virtue of the aforementioned arrangement of the segment magnets M1 to M40, a magnetic-field vector of the process vessel 3 points to the direction indicated by a large arrow of FIG. 2. To be more specific, segment magnets M1 to M40 are arranged on the oval track whose long axis corresponds to the direction of the resultant vector and whose short axis corresponds to the direction perpendicular to the resultant vector. The lengths of the long axis and short axis of the oval track are defined by various parameters constituting the magnetic field, such as the magnetic force of the segment magnet, the number of segment magnets, and the pitch between segment magnets. The long and short axes are set in such a way that the magnetic field has circular magnetic lines of force by eliminating non-uniformity (as shown in Prior Art FIG. 11B) in magnetic field between the NS direction and the direction (EW direction) perpendicular to the NS direction.

Figure 4:
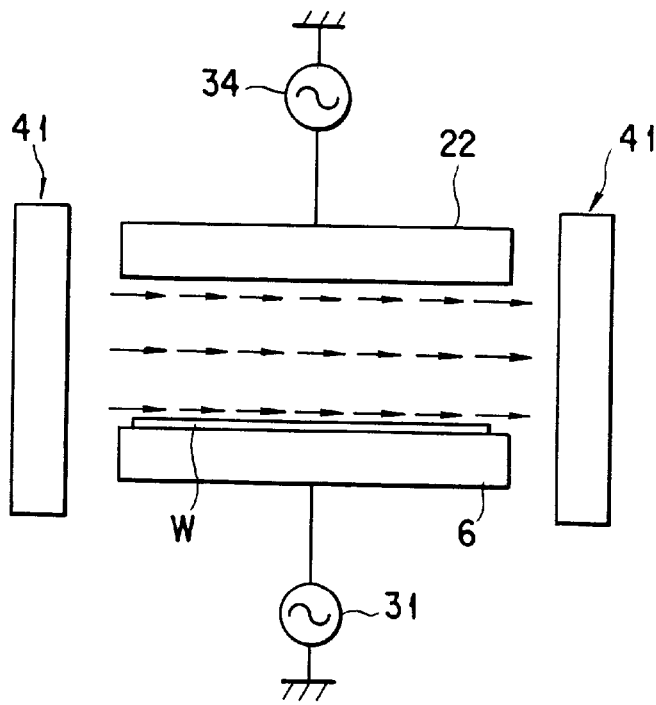
FIG. 4 is a view for illustrating the profile of the magnetic field formed in a process chamber of the etching device of FIG. 1, as viewed from the side.

The main section of the etching device 1 according to this embodiment is constituted as mentioned above. By virtue of the aforementioned arrangement of the dipole ring magnet 41, a magnetic field is formed substantially in parallel to the plane surface including the wafer W, (viewing from the side toward the Y axis) when the dipole ring magnet 41 is at a standstill, as shown in FIG. 4.

Figure 5A:
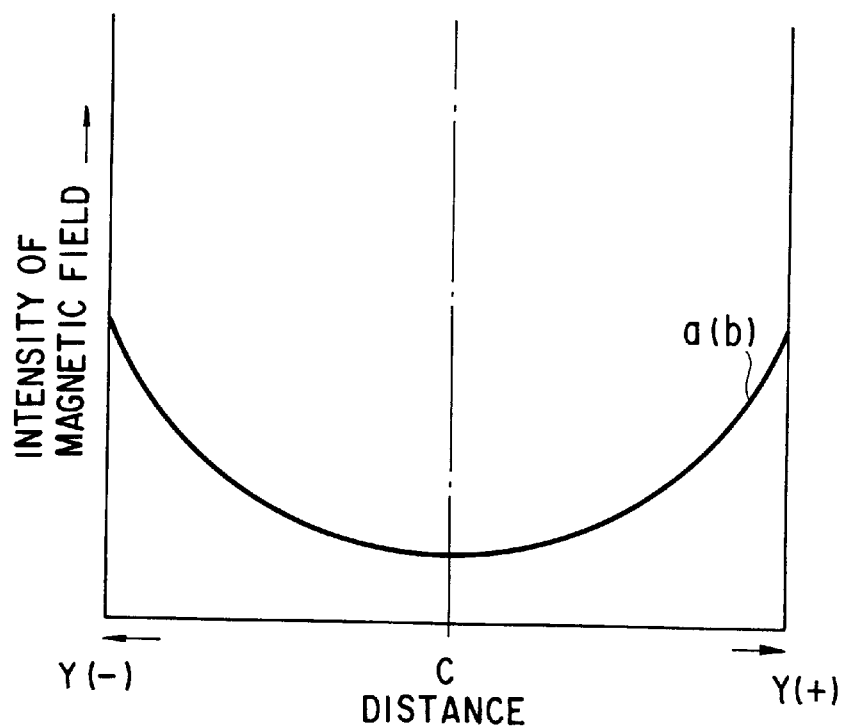
FIGS. 5A and 5B are views for illustrating a gradient of the magnetic field above a wafer disposed in the etching device of FIG. 1, viewing from a side and top, respectively.
Figure 5B:
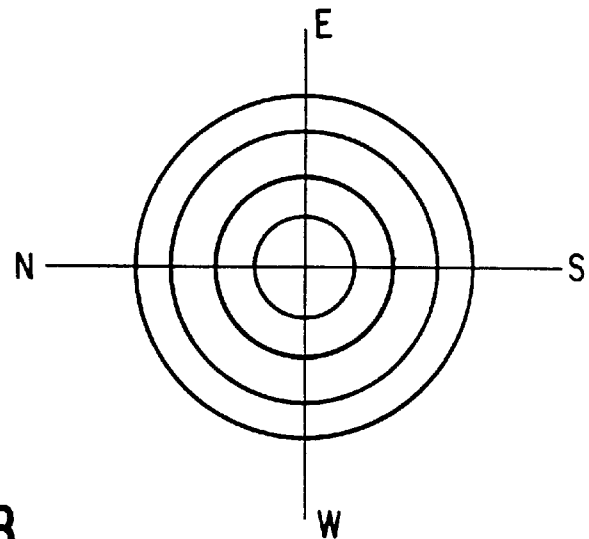
Figure 11A:
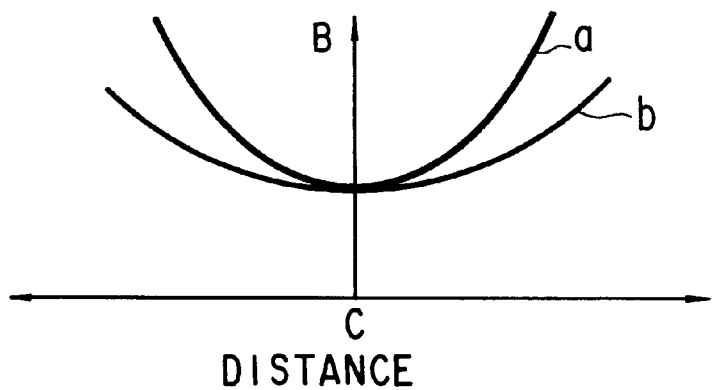
FIGS. 11A and 11B are diagrams showing a strength distribution of the magnetic field formed in the plasma process device employing a conventional dipole ring magnet.
Figure 11B:
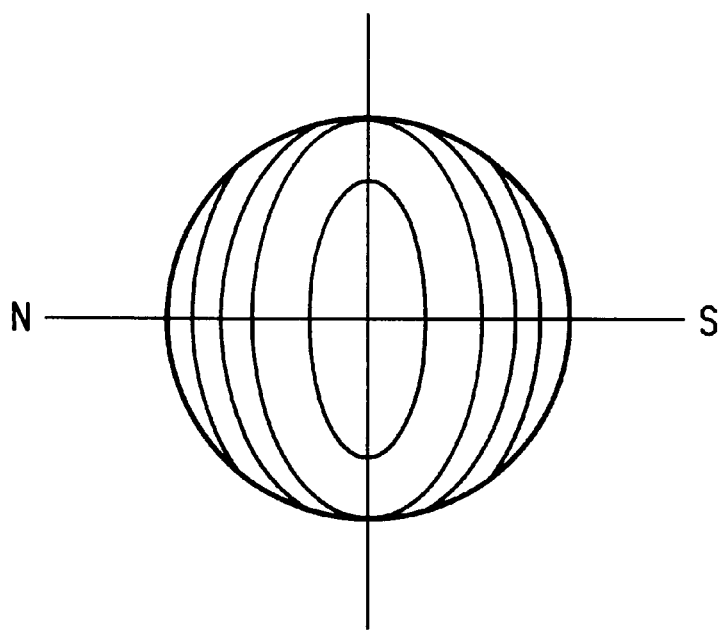

Furthermore, when the dipole ring magnet 41 is at a standstill (the rotation stage 42 is stopped), the distribution of the magnetic-field strength (curve a) in the NS-pole direction virtually corresponds to that (curve b) in the EW-pole direction, as shown in FIG. 5A corresponding to Prior Art FIG. 11A. As shown in FIG. 5B corresponding to Prior Art FIG. 11B, lines connecting the points showing the positions of the same magnetic intensity in the magnetic field form substantially concentric circles about the center of the wafer.

Hereinbelow, we will explain an etching process and an etching operation of, for example, an $SiO_2$ film on a silicon wafer W by use of the etching device 1 according to this embodiment. Next to a side surface of the etching device 1, a loadlock chamber (not shown) containing wafer transfer means, such as a transfer arm, is placed with a gate valve 9 interposed therebetween. When the wafer W is loaded into or unloaded from the process vessel 3, the susceptor 6 is descended to a predetermined position by means of the driving mechanism 8.

Then, the wafer W is transferred into the process chamber 2 from the loadlock chamber (not shown) and set at the predetermined position on the susceptor 6 by holding means such as an electrostatic chuck. Subsequently, the susceptor 6 is ascended to the predetermined etching position (shown in FIG. 1) by means of the driving mechanism 8. Simultaneously, the process chamber 2 is evacuated by vacuum means 13. When the pressure of the process chamber is reduced to a predetermined value, a predetermined process gas, e.g., $CF_4$, is supplied at a predetermined flow rate. Therefore, the pressure of the process chamber 2 is set and maintained at a predetermined value, for example, 20 mTorr.

Subsequently, a high frequency power of 2 kW having a frequency of 27.12 MHz is supplied to an upper electrode 22 from the second high frequency power source 34, molecules of the etching gas (e.g., $CF_4$ gas) present in the process chamber 2 are dissociated to generate a plasma. At the same time, high frequency power (frequency: 800 kHz, power: 1 kW) is supplied to the susceptor 6 from the first frequency power source 31.

Furthermore, the rotation stage 42 is rotated about the center axis of the wafer by means of driving means 43 and subsequently the dipole ring magnet 41 is rotated around the process vessel 3. As a result, a uniform magnetic field parallel to the wafer W is formed above the wafer W. In other words, the parallel magnetic field is formed in the direction perpendicular to the electric field formed by the high frequency power source.

The magnetic field thus formed induces E×B drift movement of the plasma electrons. The drifting electrons impinge on neutral molecules, causing further dissociation of the electrons. As a result, the plasma density of the process vessel 3 becomes extremely high. On the other hand, the magnetic field thus generated suppresses dispersion of the electrons causing no E×B drift movement present even in a bulk. This suppression phenomenon also contributes to increasing the plasma density.

The silicon oxide ($SiO_2$) film on the wafer surface W is etched while the incident energy of the high-density etchant ions generated in such a plasma atmosphere is controlled, separately from the plasma generation process, by a relatively low high-frequency (800 kHz) supplied to the susceptor 6 from the first high frequency power source 31. Hence, a predetermined etching can be applied to the wafer W without causing damage and at a high etching rate with a uniform depth over the entire surface.

Since a plurality of segment magnets M1 to M40 are arranged ovally in the dipole ring magnet 41 of the etching device 1, the magnetic field formed in the process chamber 2 is corrected. As a result, the uniform magnetic field is obtained in the process chamber 2, more specifically, in the magnetic field in the space from the process surface of the wafer to the outer peripheral margin and the above space responsible for the plasma generation. Hence, the plasma-process can be applied to the wafer uniformly.

The segment magnets M1 to M40 are formed of the same material. Therefore, even if the plasma process device increases in size in association with the enlargement of the wafer, it is only necessary to increase the number of the segment magnets made of the same material. As a result, the manufacturing cost of the segment M can be reduced.

Hereinbelow, a second embodiment will be explained in which the present invention is applied to an etching device. In the following description, like reference numerals designate like structural elements and further explanation is omitted for brevity's sake.

Figure 6:
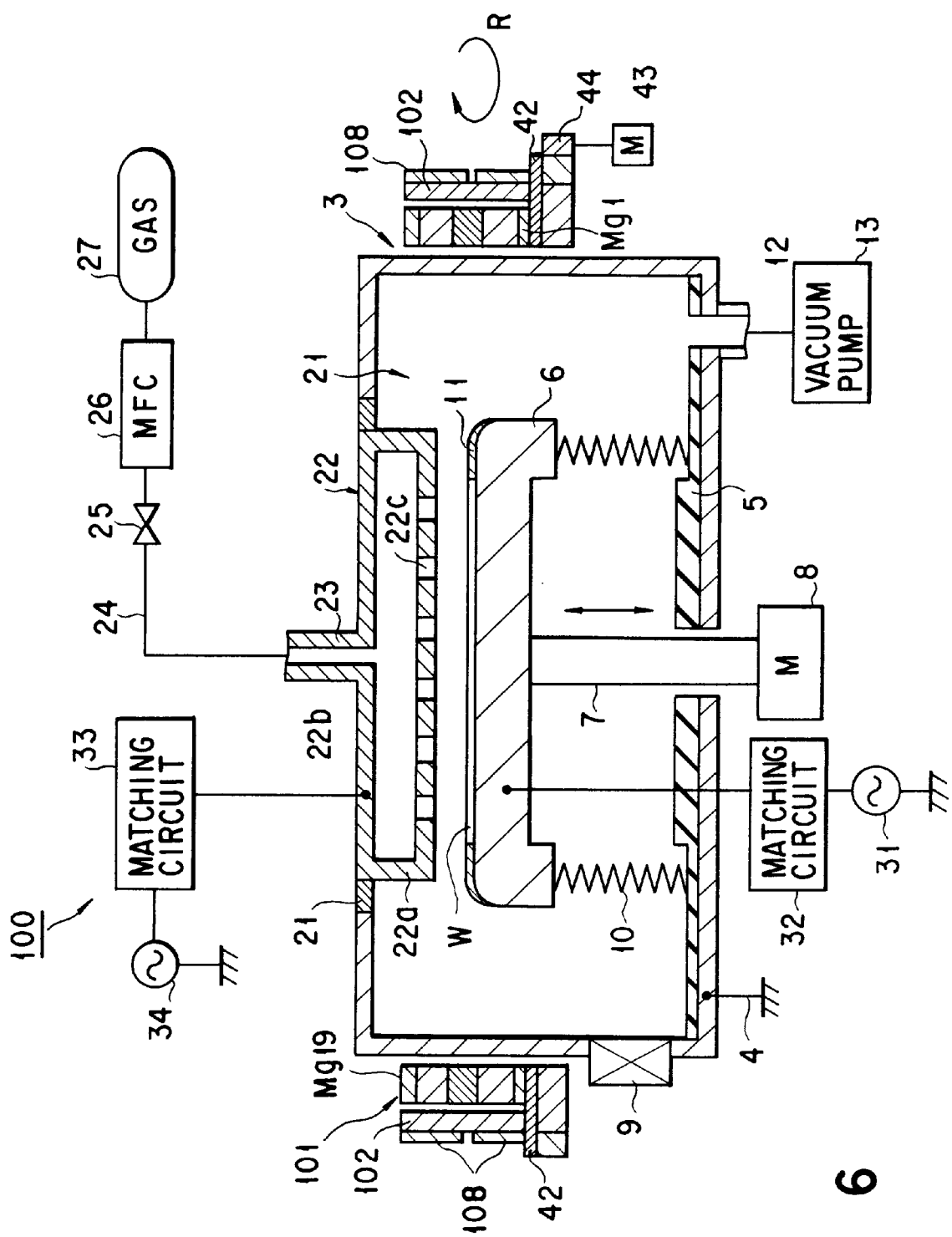
FIG. 6 is a schematically cross-sectional view of the etching device according to a second embodiment of the present invention.
Figure 7:
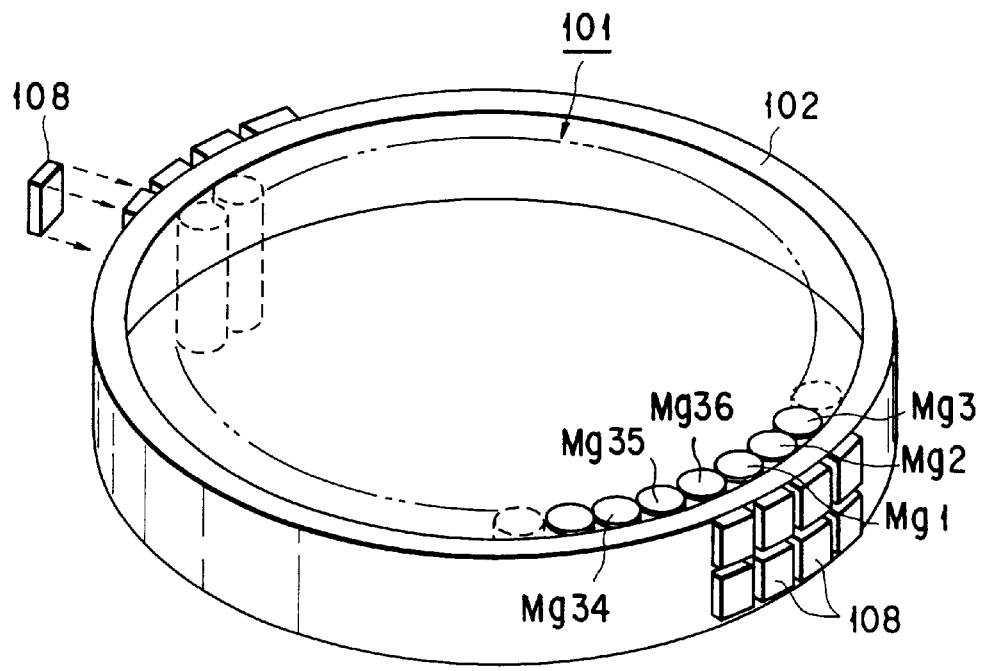
FIG. 7 is a perspective view of the dipole ring magnet employed in the etching device of FIG. 6.

FIG. 6 is a schematic cross-sectional view of the etching device 100 according to the second embodiment. On the outer periphery of the process vessel 3, a dipole ring magnet 101 is arranged as a magnetic field generation means. The dipole ring magnet 101 has segment magnets Mg 1 to Mg 36 arranged circularly on the circular rotation stage 42 as shown in FIG. 7. The segment magnets Mg 1 to Mg 36 have the same shape and size. However, they are arranged on the rotation stage 42 according to predetermined magnetizing directions individually set, in the same manner as in Embodiment 1.

On the rotation stage 42, a magnetic shield ring 102, which is a circular-ring magnetic material, is formed so as to surround the dipole ring magnet 101 and in contact with or at a small distance apart from the dipole ring magnet 101. The shield ring 102 can be rotated in synchronism with the magnet 101.

Figure 8:
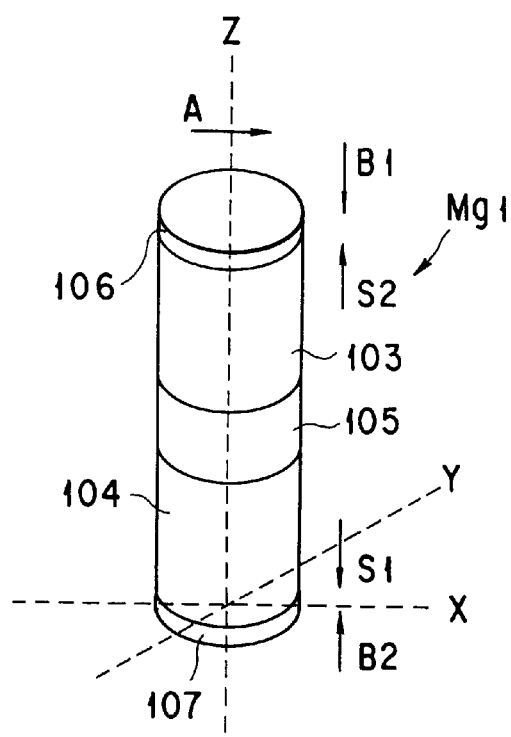
FIG. 8 is a perspective view of a segment magnet employed in the dipole ring magnet of FIG. 6.

Since the segment magnets Mg 1 to Mg 36 have the same shape and size as described above, we will take a segment magnet Mg 1 as a representative example for the following explanation. The segment magnet Mg 1 is an entirely cylindrical form and consists of cylindrical magnetic materials 103 and 104 (the same shape and size) and a non-magnetic circular board 105 interposed between the materials 103 and 104. The non-magnetic circular board 105 is made of an aluminum material and has the same diameter as the materials 103 and 104. Then, the construct thus obtained is magnetized as shown in FIG. 8 to obtain the segment magnet Mg 1. More specifically, the magnetic materials 103 and 104 are magnetized as shown by an arrow A (FIG. 8) for the diameter direction (the point of the arrow indicates the north pole). Note that the magnetizing directions of the magnetic material 103 and 104 are identical.

Onto the upper end and the lower end of the segment Mg 1, auxiliary permanent magnets 106 and 107 having the same diameter as that of the segment Mg 1 are unmovably provided, as shown in FIG. 8. The magnetizing directions of the auxiliary magnets 106 and 107 are set in such a way that each of the north poles vertically points to the center of the segment magnet Mg 1, as indicated by arrows B1 and B2. The vertical components of the magnetic field (formed by the segment magnet Mg) can be decreased. That is, the generation of the upwardly and downwardly projected curve components on the upper and down sides of the magnetic field may be suppressed.

To explain more specifically, vertical components, that is, components in the Z direction (shown by arrows S1 and S2 in FIG. 8) of the magnetic field of the segment magnet Mg in the process chamber 2, can be corrected by the magnetic field (indicated by arrow B1 and B2) generated by the auxiliary magnets 107 and 106. Hence, the magnetic field parallel to the wafer can be formed in the process chamber 2.

As is the same as segment Mg 1, the other segment magnets Mg 2 to Mg 36 have the auxiliary magnets 106 and 107 fixed on the upper and lower ends. The dipole ring magnet 101 formed of the segment magnets Mg 1 to Mg 36 is rotated in the same manner as in the dipole ring magnet 41. Hence, detailed explanation will be omitted. The vector of the magnetic field formed in the process chamber 2 points to the direction indicated by a large arrow in FIG. 9. To the predetermined portions around the shield ring 102, counter magnets 108 are provided as shown in FIG. 7. The counter magnets 108 generate magnetic fields for preventing the leakage of the magnetic field. The counter magnet 108 has a virtually rectangular shape as a whole and is magnetized in the direction indicated by an arrow in FIG. 10. These counter magnets 108 are arranged in such a way that their magnetizing direction (indicated by an arrow) are virtually the same as the vector direction (indicated by a large arrow c) of the magnetic field formed by the dipole ring magnet 101, as shown in FIG. 9.

Figure 9:
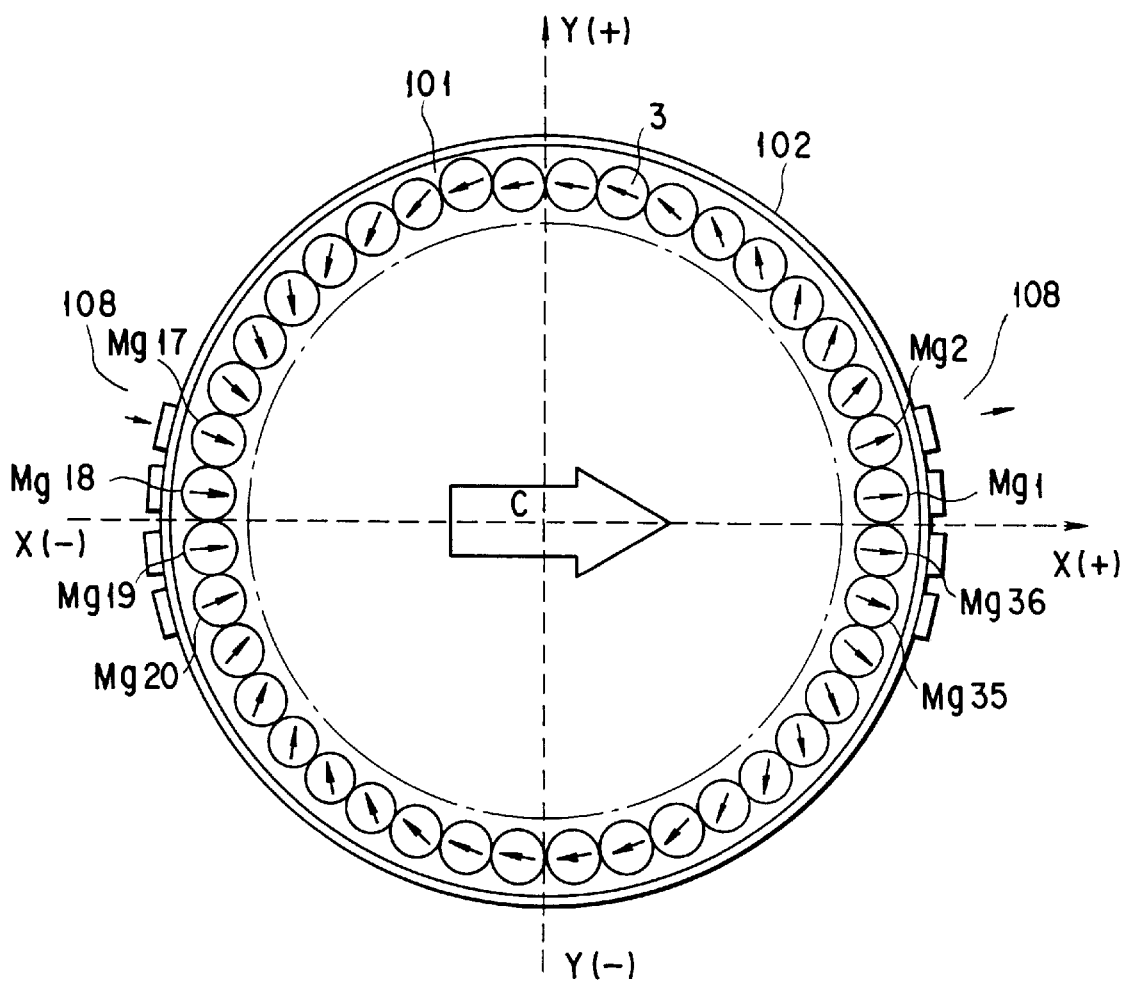
FIG. 9 is a plan view of a dipole ring magnet used in the etching device of FIG. 6, showing the magnetizing direction of individual segment magnets arranged in the dipole ring magnet.
Figure 10:
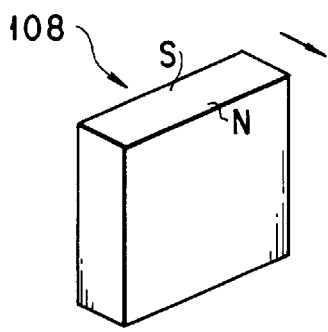
FIG. 10 is a perspective view of a counter magnet provided on a shield ring of the dipole ring magnet of FIG. 6.

In this embodiment, counter magnets 108 thus constructed are arranged in the direction of the magnetic-field vector, as shown in FIGS. 7 and 9. To explain more precisely, 8 vertically-arranged pairs of counter magnets (16 magnets in total) are provided on the outside of the shield ring 102. Each pair of counter magnets is provided so as to correspond to Mg 35 to Mg 2 and Mg 17 to Mg 20. A group of counter magnets corresponding to Mg 35 to Mg 2 and a group of the segment magnets corresponding to Mg 17 to Mg 20 are symmetrically arranged on the magnetic-field vector as shown in FIG. 9. The counter magnet groups 108 provided on the shield ring 102 are magnetized as follows. The counter magnets corresponding to Mg 35 to Mg 2 are magnetized in such a way that the north pole points to the outside of the ring. On the other hand, the counter magnets corresponding to Mg 17 to Mg 20 are magnetized in such a way that the north pole points to the inside of the ring.

The main section of the etching device 100 according to Embodiment 2 is constructed as described above. The vertical component of the magnetic field generated by the segment magnets Mg 1 to Mg 36 is properly corrected by the auxiliary magnets 106 and 107. In this manner, the magnetic field extending upwardly and downwardly in the form of a convex can be corrected. As a result, the magnetic field parallel to the wafer is generated in the space from the substrate to the outer peripheral margin and in the space above the substrate (plasma generation space). Therefore, a desired plasma process of the substrate can be performed.

Furthermore, the magnetic field generated in the plasma process device does not influence on peripheral equipment since the leakage of the magnetic field (generated from the dipole ring magnet 101) can be prevented by the shield ring 102 and the counter magnet 108 provided on the device. The magnetic field leaks in all directions around the process vessel 3. However, the magnetic shield ring 102 provided along the outer periphery of dipole ring magnet 101 prevents the leakage of the magnetic field. Therefore, the leakage from the device to the adjacent place can be prevented. Since the counter magnets 108 are further provided along the outer periphery of the shield ring 102, the leakage of the magnetic field from the device to a distant place, can be also prevented.

Thus, if the etching device 100 and the similar device are placed adjacent to each other, they do not interfere with each other. Hence, the etching process can be performed uniformly at a desired high rate. In addition, since the leakage of the magnetic field from the device to a distant place is successfully prevented, the magnetic influences on peripheral equipment will not take place. Furthermore, even though the counter magnets 108 are partially provided to the shield ring 102, the leakage of the magnetic field from the device to a distant place can be prevented in all directions since the shield ring 102 is rotated together with the dipole ring magnet 101. These leakage prevention means consisting of the shield ring 102, the counter magnet 108 and the like, can be applied to the etching device 1 according to Embodiment 1.

As described in the Embodiments above, the segment magnets M1 to M40 and Mg 1 to Mg 36 constituting the dipole ring magnets 41 and 101, respectively, are formed of the same anisotropic magnets. Therefore, the dipole ring magnets 41 or 101 can be formed by positioning the same segment magnets in accordance with the predetermined arrangement. In short, a dipole ring magnet having a desired magnetizing direction can be obtained just by devising the arrangement of the anisotropic segment magnets. Since the segment magnets are prepared from the same material with the same constitution just in a large number, the manufacturing cost is therefore low.

The dipole ring magnets 41 and 101 used in the aforementioned Embodiments are formed of 40 segment magnets, M1 to M40, and 36 segment magnets Mg 1 to Mg 36, respectively. The number of the segment magnets may be arbitrarily chosen if necessary. For example, if the so-called "thin-out" of the segment magnets arranged on the dipole ring magnet 41 is performed to reduce the number of the segment magnets (the intervals between segment magnets are not equal and partially or entirely different), the long axis of the oval-shape dipole ring magnets 41 can be shortened while maintaining a desired magnetic field of the process chamber 2. Consequently, the resultant etching device 1 can be reduced in size. Furthermore, when the thin-out of the segment magnets Mg 1 to Mg 36 on the dipole ring magnets 101 is performed to change the interval between adjacent segment magnets from others, a minute change in the magnetic field to be generated in the process chamber 2 can be performed more easily. When the magnetic field is formed, for example, as shown in Prior Art FIG. 11B, if the distance between the segment magnets in the NS direction is set longer than that between segment magnets positioned in the EW direction (as an extreme case, by removing Mg 2, Mg 36, Mg 18, and Mg 20 from the dipole ring magnet shown in FIG. 9), the same uniform magnetic field as that in Embodiment 1 (in which the segment magnets are arranged in the same intervals on the oval track) can be obtained.

Figure 13:
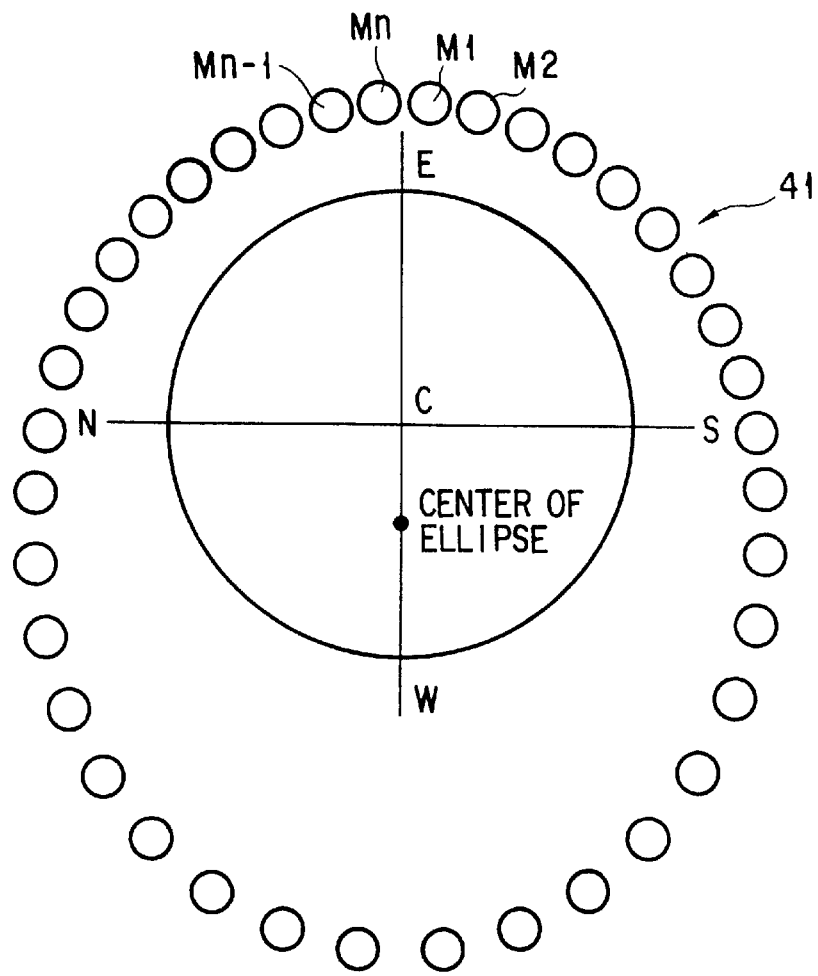
FIG. 13 is a view schematically showing a modification of the dipole ring according to the present invention.

In the conventional technique, a so-called inclined magnetic field must be generated in order to prevent the influence of the drift movement of the electrons. In the present invention, an inclined magnetic field is generated by anisotropic segment magnets M1, M2, . . . , Mn–1 and Mn. As shown in FIG. 13, the magnets M1 to Mn are arranged in an ellipse, constituting a dipole ring 41. The long axis of the ellipse extends in an EW-direction, and the short axis thereof in an NS-direction. The center of the ellipse is shifted in the EW line toward the W-pole from the center (0) of the wafer C. The magnets M1 to Mn have the same size and shape and are magnetized in the diameter direction. They are arranged in the same way as the segments M1 to M40 are arranged as shown in FIG. 2, except that they are arranged in an ellipse.

Figure 12A:
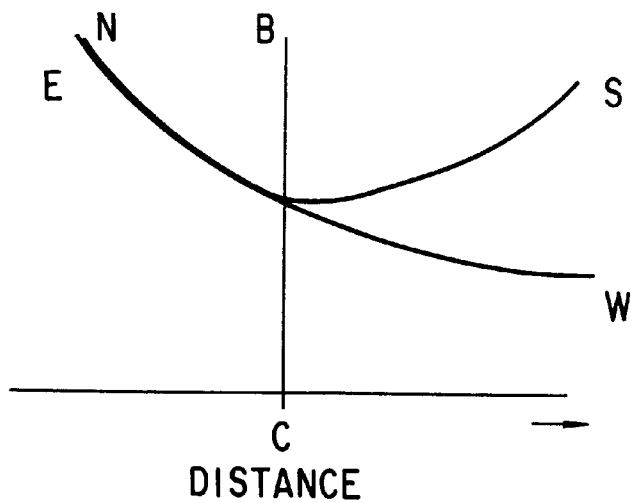
FIGS. 12A and 12B are views for illustrating an intensity distribution of a magnetic field formed by a dipole ring shown in FIG. 13.
Figure 12B:
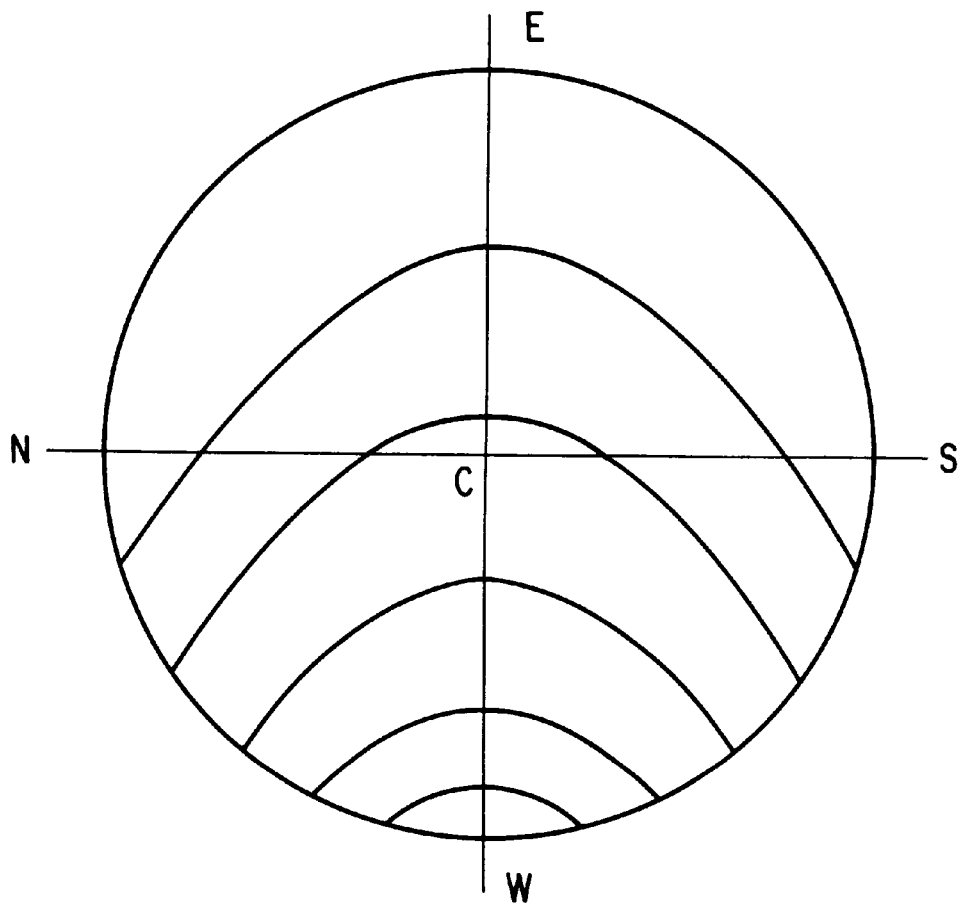

FIGS. 12A and 12B show an intensity distribution of the magnetic field formed by the dipole ring 41 shown in FIG. 13. It may be understood from these figures that the intensity of the resultant magnetic field decreases toward the W-pole side from the E-pole side to change the drift movement direction of the electrons so that the electrons are not collected on the W-pole side.

In the aforementioned embodiments, the dipole ring magnet is rotated around the process vessel. However, the dipole ring magnet is not necessarily rotated and may be immobilized on the outer peripheral surface of the process vessel with a dielectric material interposed between them.

The aforementioned embodiments relates to an etching device. The present invention is not, however, limited to the etching device and may be used in other plasma process devices such as an ashing device, a sputtering device, a CVD device. The substrate is not limited to the wafer. An LCD substrate may be used as the substrate.

According to the present invention, uniformity of the magnetic field formed in a process vessel can be improved by virtue of the presence of a dipole ring magnet characterized in that a plurality of anisotropic segment magnets are ovally arranged on the outer periphery of a process vessel or the presence of a dipole ring magnet characterized in that anisotropic segment magnets with auxiliary magnets are circularly arranged on the outer periphery of the process vessel. As a result, the plasma process of the substrate can be carried out more uniformly compared to the conventionally-performed plasma process. Furthermore, anisotropic segment magnets used in each of individual dipole ring magnets are identical. Therefore, when a larger plasma device has to be formed with an increase of the substrate, the same anisotropic segment magnets can be used by increasing their number thereof. The manufacturing cost of the anisotropic segment magnet can be reduced. If the magnetic field generation means for preventing magnetic field leakage is provided in the outer periphery of the dipole ring magnet, not only the leakage of the magnetic field from the device to the periphery but also the influence of the magnetic field on the peripheral equipment can be prevented. Furthermore, in constructing a semiconductor device manufacturing system of a multi-chamber type, the degree of freedom in the design and the uniformity of the magnetic field strength can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma process device comprising:
   a process vessel having a plasma generating area therein;
   support means provided in the process vessel, for supporting a substrate having a process surface which faces the plasma generating area;
   gas introducing means for introducing a process gas into the plasma generating area;
   plasma generation means including a dipole ring magnet arranged around the outer periphery of the process vessel for generating a magnetic field having a magnetic line of force in the proximity of the process surface, the plasma generation means generating a plasma of said process gas in the plasma generating area;
   said dipole ring magnet arranged along the outer periphery of the process vessel, and having a plurality of anisotropic segment magnets extending perpendicularly to the process surface and an auxiliary magnet provided on at least one end of each of the extending plural anisotropic segment magnets, said auxiliary magnet configured to correct a perpendicular component of a magnetic field of the process vessel.

2. The process according to claim 1, wherein said plural anisotropic segment magnets comprise cylindrical permanent magnets having the same shape and size and magnetized in the diameter direction.

3. The process device according to claim 2, wherein each auxiliary magnet has such a cylindrical shape that its diameter is the same as that of each of said cylindrical permanent magnets and is provided on at least one end of each of the anisotropic segment magnets.

4. The process device according to claim 1, wherein each of said anisotropic segment magnets has two cylindrical magnet members and a non-magnetic material interposed between said two cylindrical magnet members.

5. The process device according to claim 1, wherein said anisotropic segment magnets are arranged at the same intervals on a circular track.

6. The process device according to claim 1, further comprising:

a circular form magnetic material arranged so as to surround said dipole ring magnet; and magnetic field generation means provided on said circular form magnetic material, for preventing the leakage of the magnetic field.

7. A plasma process device comprising:

a process vessel having a plasma generating area therein, support means provided in the process vessel, for supporting a substrate having a process surface which faces the plasma generating area;

gas introducing means for introducing a process gas into the plasma generating area; and plasma generating means including a dipole ring magnet arranged around the outer periphery of the process vessel, for generating a magnetic field having a magnetic line of force in the plasma generating area, the plasma generation means generating a plasma of said process gas in the plasma generating area, proximity of said process surface, said dipole ring magnet arranged around the outer periphery of the process vessel and having a plurality of cylindrical anisotropic segment magnets having the same magnetic force and said anisotropic segment magnets arranged in such a way that a first distance between adjacent anisotropic segment magnets positioned at a north pole and at a south pole of the resultant vector of the magnetic field formed by the anisotropic segment magnets, is different from a second distance between adjacent anisotropic segment magnets positioned at an upper end and at a lower end of the line crossed perpendicularly to the N-S pole line.

8. The plasma process device according to claim 7, wherein said first distance is shorter than the second distance.

9. A plasma process device comprising:

a process vessel, having a plasma generating area therein, support means provided in said process vessel for supporting a substrate having a process surface which faces the plasma generating area;

gas introducing means for introducing a process gas into the plasma generating area; and plasma generation means including a dipole ring magnet arranged around the outer periphery of said process vessel, for generating a magnetic field having a magnetic line of force in the plasma generating area, the plasma generation means generating a plasma of said process gas in the plasma generating area, said dipole ring magnet having a plurality of anisotropic segment magnets arranged on an oval track, the long axis of said oval track extending in an EW-direction directing to east and west poles of the resultant vector of the magnetic field formed by the anisotropic segment magnet, and the short axis of said oval track extending in an NS-direction directing to north and south poles of the resultant vector of the magnetic field, and the center of the oval track being shifted to the side of the west pole from the center of the substrate.

10. A plasma process device comprising:

a process vessel having a plasma generating area therein;

support means provided in the process vessel, for supporting a substrate having a process surface which faces the plasma generating area;

gas introducing means for introducing a process gas into the plasma generating area;

plasma generation means including a dipole ring magnet arranged around the outer periphery of the process vessel for generating a magnetic field having a magnetic line of force in the proximity of the process surface, the plasma generation means generating a plasma of said process gas in the plasma generating area;

said dipole ring magnet arranged along the outer periphery of the process vessel and having a plurality of anisotropic segment magnets extending perpendicularly to the process surface and an auxiliary magnet provided on at least at one end of each of the extending plural anisotropic segment magnets, said auxiliary magnet configured to correct a perpendicular component of a magnetic field of the process vessel, wherein said plural anisotropic segment magnets comprise permanent magnets having the same shape and size and magnetized in the diameter direction and wherein each auxiliary magnet has the same cross section as that of each of the said permanent magnets, and is provided on at least one end of each of the anisotropic segment magnets.

11. A plasma process device comprising:

a process vessel having a plasma generating area therein, support means provided in the process vessel for supporting a substrate having a process surface which faces the plasma generating area;

gas introducing means for introducing a process gas into the plasma generating area; and plasma generating means including a dipole ring magnet arranged around the outer periphery of the process vessel, for generating a magnetic field having a magnetic line of force in the plasma generating area, the plasma generation means generating a plasma of said process gas in the plasma generating area proximity of said process surface, said dipole ring magnet arranged around the outer periphery of the process vessel and having a plurality of anisotropic segment magnets of the same magnetic force, said anisotropic segment magnets arranged in such a way that a first distance between adjacent anisotropic segment magnets positioned at a north pole and at a south pole of the resultant vector of the magnetic field formed by the anisotropic segment magnets is different from a second distance between adjacent anisotropic segment magnets positioned at an upper end and at a lower end of the line crossed perpendicularly to the N-S pole line.

12. The plasma device according to claim 11, wherein said first distance is shorter than the second distance.

* * * * *